United States Patent [19]

Janutka

[11] Patent Number: 4,487,457
[45] Date of Patent: Dec. 11, 1984

[54] GATING CIRCUIT FOR COMBINING SERIES AND PARALLEL CONNECTED FETS

[75] Inventor: William J. Janutka, West Allis, Wis.

[73] Assignee: Eaton Corporation, Cleveland, Ohio

[21] Appl. No.: 425,160

[22] Filed: Sep. 28, 1982

[51] Int. Cl.³ .................. H03K 17/08; H03K 17/12; H03K 17/10; H03K 17/687

[52] U.S. Cl. .................. 307/242; 307/570; 307/585; 307/577

[58] Field of Search .............. 307/241, 242, 570, 571, 307/572, 577, 582, 583, 584, 270, 304, 499, 501, 200 B, 352, 353, 585, 579; 357/23 GP

[56] References Cited

U.S. PATENT DOCUMENTS 4,277,696 7/1981 Tokunaga et al. .............. 307/288 X

FOREIGN PATENT DOCUMENTS 723782 3/1978 U.S.S.R. .............. 307/582

OTHER PUBLICATIONS

Evans, *Designing with Field Effect Transistors*, McGraw-Hill, Inc., pp. 207-215 and 273-274, 1981.

Kooi et al., "MOS Moves into Higher Power Applications", Electronics, pp. 98-103, Jun. 24, 1976.

Fink et al., *Electronics Engineers' Handbook*, McGraw-Hill, Inc., pp. 16-15 and 16-16, 1975.

*Primary Examiner*—Larry N. Anagnos
*Assistant Examiner*—David R. Bertelson
*Attorney, Agent, or Firm*—Andrus, Sceales, Starke & Sawall

[57] ABSTRACT

Gating circuitry is provided for controlling a plurality of power FETs stacked in series and parallel. A plurality of parallel circuit branches are connected between main terminals, each branch having a plurality of series connected power FETs. All power FETs are turned ON and OFF from a single gate terminal. Trigger means responds to one polarity gate signal to supply gate charging current to all the FETs. The trigger means responds to the opposite polarity gate signal to directly deplete gate charge from selected power FETs. The remaining power FETs have their gate charges depleted through individual self turn-off circuits between their gate and source which becomes conductive in the absence of gate charging current.

10 Claims, 1 Drawing Figure

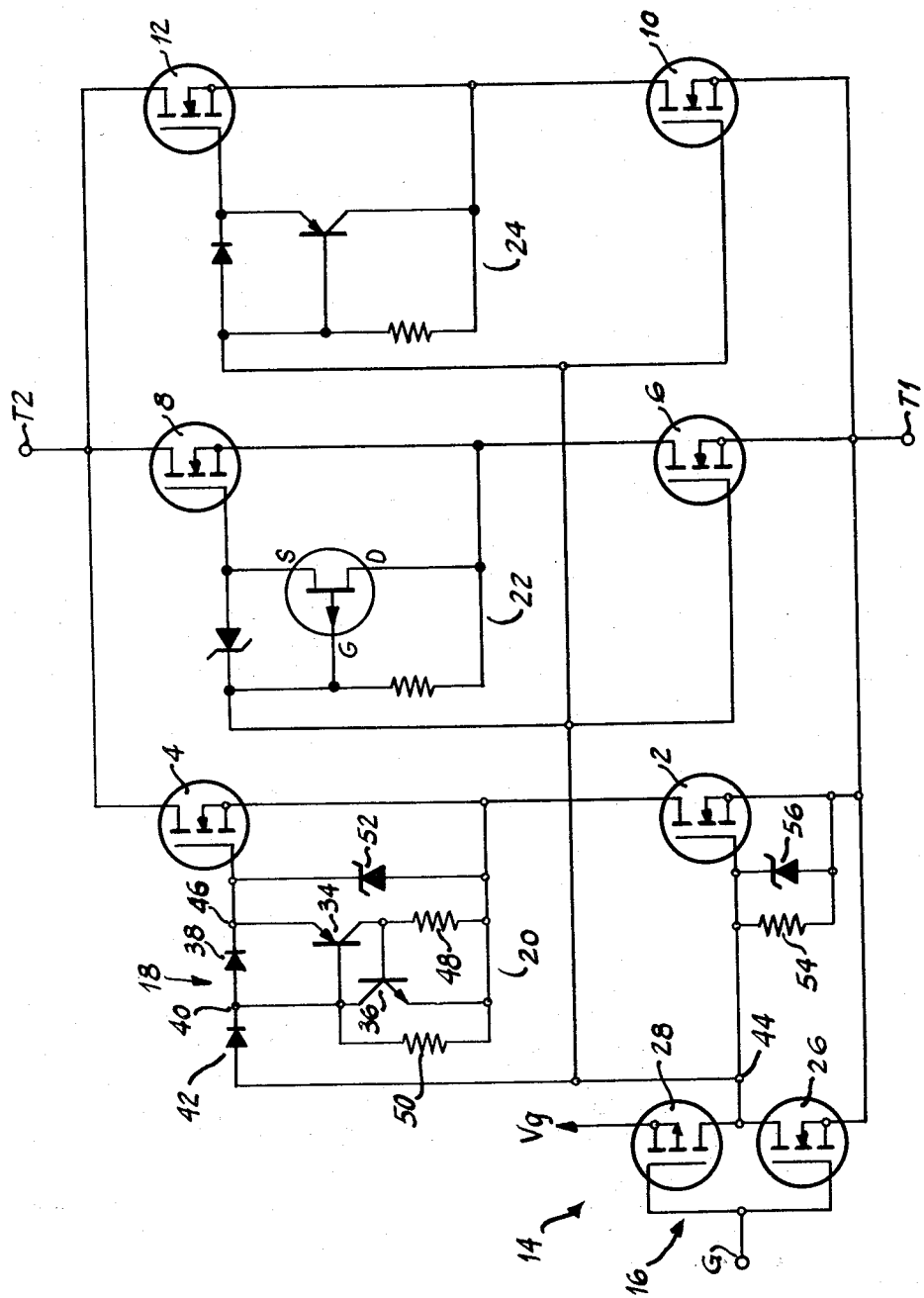

GATING CIRCUIT FOR COMBINING SERIES AND PARALLEL CONNECTED FETS

BACKGROUND AND SUMMARY

The invention relates to power FETs (field effect transistors), and more particularly to gating circuitry for controlling a plurality of power FETs stacked in a series and parallel.

The stacking of power FETs is known. Stacking is the interconnection of multiple devices in configurations that result in capabilities beyond those of a single device. The present invention arose from efforts to develop gating techniques for a combination of two stacking techniques, series and parallel.

The stacking of multiple power FETs in parallel provides higher current capability, and lower ON resistance. Gating speed must be fast because the turn-on and turn-off transition time difference must be minimized.

The stacking of multiple power FETs in series results in higher voltage capability, and a better ratio of ON resistance to breakdown voltage. For example, connecting a pair of 100 volt devices in series results in a total voltage capability of 200 volts. The ON resistance in an individual power FET is proportional to the blocking voltage raised to the 2.6 power. Thus, doubling the blocking voltage in a single device results in an ON resistance which is increased more than six times. Stacking of a pair of devices in series affords the increased voltage blocking capability but with lower total ON resistance.

Various problems are encountered in the gating of series stacked power FETs, including voltage isolation and differing gate triggering levels. Each of the gates wants to reference to a different level, but it is desirable to drive all the gates from the same source via a single gate terminal.

The combination of parallel and series stacked power FETs affords both higher current capability and higher voltage capability, along with lower ON resistance. A plurality of power FETs are stacked in series until a given voltage rating is met. Additional groups of series stacked FETs are added in parallel until a given current rating and ON state resistance is met.

The present invention provides simple and efficient gating circuitry for controlling a set of series and parallel stacked power FETs.

BRIEF DESCRIPTION OF THE DRAWING

The drawing is a circuit diagram of series and parallel stacked FET gating circuitry in accordance with the invention.

DETAILED DESCRIPTION

The drawing shows a plurality of power FETs stacked in series and parallel for conducting current between main terminals T1 and T2 under control of a single gate terminal G. A plurality of parallel circuit branches are provided between T1 and T2, each branch having a plurality of series connected power FETs. For example, a plurality of sets of power FETs 2 and 4, 6 and 8, and 10 and 12 are provided. Each set is connected in parallel with the remaining sets. Each set comprises at least first and second series connected power FETs, such as 2 and 4.

Gating means 14 is a typical circuit for turning the FETs ON and OFF from a single gate terminal G. The gating means includes trigger means 16 responsive to one polarity gate signal to supply gate charging current from power source $V_g$ to the first and second FETs of each pair, and responsive to the opposite polarity gate signal on terminal G to deplete gate charge from each of the first FETs 2, 6 and 10 of the pairs. The gating means further includes fast gate turn-off means such as 18 in the gate circuits of the second FETs 4, 8 and 12 of the pairs to deplete gate charge from each of the second FETs 4, 8 and 12 of the pairs in the absence of gate charging current.

In the preferred embodiment, n-channel power FETs are provided. The sources of the first FETs 2, 6 and 10 of the pairs are connected to the first main terminal T1. The drains of the first FETs 2, 6 and 10 of the pairs are connected to respective sources of the second FETs 4, 8 and 12 of the pairs. The drains of the second FETs 4, 8 and 12 of the pairs are connected to the second main terminal T2. The fast gate turn-off means comprise a plurality of fast turn-off circuits 20, 22 and 24, each connected between the gate and source of a respective second FET 4, 8 and 12 of the pairs. Each fast turn-off circuit 20, 22 and 24 is non-conductive in response to gate charging current $V_g$. Each fast turn-off circuit 20, 22 and 24 becomes conductive upon removal of gate charging current, to provide discharge therethrough of residual charge in the gate to source capacitance of the second FETs 4, 8 and 12 of the pairs.

Trigger means 16 comprises first and second triggering transistors 26 and 28 alternately driven into conduction by different polarity gate signals on terminal G. Transistors 26 and 28 are connected to the gates of the power FETs and to the fast turn-off circuits. In preferred form, the first triggering transistor 26 is an n-channel FET having a source connected to main terminal T1, and having a gate connected to the single gate terminal G. The second triggering transistor 28 preferably comprises a p-channel FET having a source connected to the gate charging current supply from $V_g$, and having a gate connected to terminal G. The drains of FETs 26 and 28 are connected together and to the gates of the power FETs and also to the fast turn-off circuits.

In operation, a negative polarity gate signal on terminal G renders transistor 26 nonconductive, and transistor 28 conductive. Conduction of transistor 28 supplies gate charging current therethrough from $V_g$ to the gates of the first and second power FETs in each pair 2 and 4, 6 and 8, and 10 and 12. Conduction is thus enabled between main terminals T1 and T2 through the parallel circuit branches of series stacked power FETs.

An opposite or positive polarity gate signal on terminal G renders transistor 26 conductive, and transistor 28 non-conductive. Nonconduction of the second triggering transistor 28 blocks gate charging current. Conduction of the first triggering transistor 26 depletes gate charge therethrough from the gates of the first FETs 2, 6 and 10 of the pairs. Fast turn-off circuits 20, 22 and 24 become conductive and deplete gate charge therethrough from the gates of the second FETs 4, 8 and 12 of the pairs.

In preferred form, each of the fast gate turn-off circuits 20, 22 and 24 is like that shown in my copending Application Ser. No. 390,482, filed June 21, 1982. Referring to circuit 20, regenerative switch means is connected to the gate of FET 4 and driven into latched conduction by residual stored charge in the gate to source capacitance of FET 4 upon turn-off of the latter due to removal of gate drive. The conduction of the regenerative switch means stays latched ON until the residual stored gate charge of FET 4 is depleted or drained off. Conduction of fast turn-off circuit 20 provides faster discharge therethrough of the gate of FET 4 following turn-off of FET 2 by discharge through conducting transistor 26. This in turn facilitates faster turn-off of the stacked FET combination.

The regenerative switch means in fast turn-off circuit 20 comprises regeneratively coupled transistors, such as bipolar PNP transistor 34 and bipolar NPN transistor 36. A diode 38 has its cathode connected to the gate of FET 4 and its anode connected at point 40 through diode 42 to the common drain point 44 of transistors 26 and 28. The emitter of transistor 34 is connected to a point 46 between diode 38 and the gate of FET 4. The base of transistor 34 is connected to the collector of transistor 36 and each is connected in common to point 40. The collector of transistor 34 is connected to the base of transistor 36 and is also connected through a resistor 48 to the source of transistor 4. The emitter of transistor 36 is connected to the source of transistor 4. A resistor 50 is connected between the base of transistor 34 and the source of transistor 4. Zener diode 52 is connected between the gate and source of transistor 4 to provide protection of the gate against over-voltage.

Upon application of gate drive through diode 42 to point 40, diode 38 becomes forward biased and the emitter-base junction of transistor 34 becomes reverse biased. The voltage on the gate of FET 4 rises, turning the latter ON. When gate drive at point 40 is removed, diode 38 becomes reverse based and the emitter-base junction of transistor 34 becomes forward biased, rendering the latter conductive.

The forward biasing of the base-emitter junction of transistor 34 is effected by the residual stored charge in the gate to source capacitance of FET 4. Resistor 50 provides a return path back to the source of FET 4 for the forward current flow across the base-emitter junction of transistor 34. Since diode 38 is reverse biased at turn-off, it blocks current flow therethrough between the gate of FET 4 and the base of transistor 34 and thus insures biasing of transistor 34 into conduction. Conduction of transistor 34 supplies base drive to transistor 36 whose conduction in turn draws base current from transistor 34 to thus complete a regenerative loop therebetween. This loop stays conductive until the charge on the gate of FET 4 is depleted. The result is a fast turn-off FET circuit which requires only a small additional gating current for turn-on, due to the additional resistor 50, but requires no reverse gating current for turn-off while still turning OFF rapidly. Since the base transistor 34 is connected to point 40, fast turn-off circuit 20 is biased OFF in response to gate drive from $V_g$ through diode 42 to the gate of FET 4. This prevents draining of gate drive away from the gate of FET 4 during turn-on. Resistor 48 prevents high temperature leakage in transistor 36 from causing excessive current requirements into point 40.

The gate circuitry for the first power FETs 2, 6 and 10 of the pairs preferably includes a resistor such as 54 between the gate and source, and a zener diode such as 56 between the gate and source to protect the gate from over-voltage.

In other embodiments, the fast turn-off circuitry 20, 22 and 24 may be like that shown in my copending Application Ser. No. 390,720 or 390,481, filed June 21, 1982. In the former, a fast turn-off circuit 22 is provided by a JFET in the gate circuit of the power FET which is connected to the same gate drive terminal as the power FET. The JFET becomes conductive upon turn-off of the power FET due to removal of gate drive. Conduction of the JFET provides faster discharge therethrough of residual stored charge on the power FET gate, whereby to facilitate faster turn-off. A zener diode is connected in the gating circuitry and has a greater breakover voltage than the pinch-off voltage of the JFET, such that during turn-on, gate drive first pinches OFF the JFET and then charges up the power FET gate to drive the power FET into conduction. In the latter, nonregenerative bipolar transistor means 24 is provided in the gate circuit of the FET to facilitate fast turn-off without reverse gating current and its attendant auxiliary power supply.

It is recognized that various modifications are possible within the scope of the appended claims.

I claim:

1. A series and parallel stacked FET gating circuit comprising:
    a plurality of parallel circuit branches connected between first and second main power terminals, each branch having a plurality of series connected power FETs;
and
    gating means for turning said FETs on and off from a single gate terminal, including trigger means responsive to one polarity gate signal to supply gate charging current to all said FETs, and responsive to the opposite polarity gate signal to directly deplete gate charge from selected said FETs, and including fast gate turn-off means for depleting the gate charges of the remaining said FETs through individual self turn-off circuits between their respective gate and source, which circuits become conductive in the absence of gate charging current.

2. The invention according to claim 1 wherein said trigger means directly depletes gate charge from the first FET in each said branch, and wherein all remaining said FETs in said branches have individual dedicated said self turn-off circuits.

3. The invention according to claim 2 wherein:
    said trigger means comprises first and second triggering transistors alternately driven into conduction by said one and said opposite polarity gate signals, said first and second triggering transistors being connected to the gates of said first FETs and connected to said self turn-off circuits of said remaining FETs;
    said one polarity gate signal renders said first triggering transistor nonconductive and said second triggering transistor conductive, conduction of said second triggering transistor supplying gate charging current therethrough to the gates of all said FETS; and
    said opposite polarity gate signal renders said first triggering transistor conductive and said second triggering transistor nonconductive, nonconduction of said second triggering transistor blocking said gate charging current, conduction of said first triggering transistor depleting gate charge therethrough from the gates of said first FETs; and
    each said self turn-off circuit being nonconductive in response to said gate charging current, each said self turn-off circuit becoming conductive upon removal of said gate charging current to provide discharge therethrough of residual charge in the gate to source capacitance of the respective said FET.

4. A series and parallel stacked FET gating circuit comprising:

a plurality of parallel-connected branches of serially connected power FETs connected between first and second main power terminals, each branch comprising at least a first and second power FET; and gating means for turning said FETs ON and OFF from a single gate terminal, including trigger means responsive to one polarity gate signal to supply gate charging current to said first and second FETs of each branch, and responsive to the opposite polarity gate signal to deplete gate charge from each of said first FETs, and further including fast self gate turn-off means in the gate circuits of said second FETs to deplete gate charge from each of said second FETs in the absence of said charging current.

5. The invention according to claim 4 wherein:

each said FET has a source, drain and gate;

the sources of said first FETs are connected to said first main power terminal;

the drains of said first FETs are connected to respective sources of said second FETs;

the drains of said second FETs are connected to said second main power terminal;

said fast self gate turn-off means comprises a plurality of fast self turn-off circuits each connected between the gate and source of a respective said second FET, each said fast self turn-off circuit being nonconductive in response to said gate charging current, each said fast self turn-off circuit becoming conductive upon removal of said gating charging current to provide discharge therethrough of residual charge in the gate to source capacitance of said second FET;

said trigger means comprises first and second triggering transistors alternately driven into conduction by said one and said opposite polarity gate signals, said first and second triggering transistors being connected to the gates of said first FETs and connected to said fast self turn-off circuits of said second FETs;

said one polarity gate signal renders said first triggering transistor nonconductive and said second triggering transistor conductive, conduction of said second triggering transistor supplying gate charging current therethrough to the gates of said first and second FETs in each said set; and said opposite polarity gate signal renders said first triggering transistor conductive and said second triggering transistor nonconductive, nonconduction of said second triggering transistor blocking said gate charging current, conduction of said first triggering transistor depleting gate charge therethrough from the gates of said first FETs.

6. The invention according to claim 5 wherein said first triggering transistor comprises an n-channel FET having a source connected to said first main power terminal and having a gate connected to said single gate terminal, said second triggering transistor comprises a p-channel FET having a source connected to a gate charging current supply and having a gate connected to said single gate terminal, said n-channel triggering FET and said p-channel triggering FET having drains connected together and to the gates of said power FETs of said branches and said fast self turn-off circuits.

7. A series and parallel stacked FET gating circuit comprising:

a plurality of parallel-connected branches of serially connected power FETs connected between first and second main power terminals, each branch comprising at least a first and second power FET; and gating means for turning said FETs ON and OFF from a single gate terminal, including trigger means responsive to one polarity gate signal to supply gate charging current to said first and second FETs of each branch, and responsive to the opposite polarity gate signal to deplete gate charge from each of said first FETs, and further including fast gate turn-off means in the gate circuits of said second FETs to deplete gate charge from each of said second FETs in the absence of said charging current, wherein:

each said FET has a source, drain and gate;

the sources of said first FETs are connected to said first main power terminal;

the drains of said first FETs are connected to respective sources of said second FETs;

the drains of said second FETs are connected to said second main power terminal;

said fast gate turn-off means comprises a plurality of fast turn-off circuits each connected between the gate and source of a respective said second FET, each said fast turn-off circuit being nonconductive in response to said gate charging current, each said fast turn-off circuit becoming conductive upon removal of said gating charging current to provide discharge therethrough of residual charge in the gate to source capacitance of said second FET;

said trigger means comprises first and second triggering transistors alternately driven into conduction by said one and said opposite polarity gate signals, said first and second triggering transistors being connected to the gates of said first FETs and connected to said fast turn-off circuits of said second FETs;

said one polarity gate signal renders said first triggering transistor nonconductive and said second triggering transistor conductive, conduction of said second triggering transistor supplying gate charging current therethrough to the gates of said first and second FETs in each said branch;

said opposite polarity gate signal renders said first triggering transistor conductive and said second triggering transistor nonconductive, nonconduction of said second triggering transistor blocking said gate charging current, conduction of said first triggering transitor depleting gate charge therethrough from the gates of said first FETs; and each said fast turn-off circuit comprising regenerative switch means connected to the gate of said second power FET and driven into latched conduction by residual stored charge in the gate to source capacitance of said second power FET upon turn-off of the latter due to removal of said gate charging current, said conduction of said regenerative switch means remaining latched ON until the charge on said gate of said second power FET is depleted, such that conduction of said regenerative switch means provides faster discharge therethrough of the gate of said second power FET, whereby to facilitate faster turn-off of the latter.

8. The invention according to claim 5 wherein each said fast self turn-off circuit comprises a depletion mode JFET connected to said gate of said second power FET and conductive upon turn-off of the latter due to removal of said gate charging current, conduction of said JFET providing faster discharge therethrough of residual stored charge on said gate of said second power FET, whereby to facilitate faster turn-off of the latter.

9. The invention according to claim 5 wherein each said fast self turn-off circuit comprises nonregenerative switch means connected to said gate of said second power FET and driven into conduction by residual stored charge in the gate to source capacitance of said second power FET upon turn-off of the latter due to removal of said gate charging current, such that conduction of said nonregenerative switch means provides faster discharge therethrough of said gate of said second power FET, whereby to facilitate faster turn-off of the latter.

10. The invention according to claim 5 wherein the gate charges of all of said first FETs are depleted through said first triggering transistor when the latter is conductive, and wherein the gate charges of said second FETs are depleted through individual said fast self turn-off circuits dedicated to a respective one of said second FETs.

* * * * *